(12) United States Patent
Wu et al.

(10) Patent No.: US 9,128,169 B2
(45) Date of Patent: Sep. 8, 2015

(54) TEST STRUCTURE OF DISPLAY PANEL AND TESTING METHOD THEREOF AND TEST STRUCTURE OF TESTED DISPLAY PANEL

(71) Applicant: E Ink Holdings Inc., Hsinchu (TW)

(72) Inventors: Chi-Ming Wu, Hsinchu (TW); Shu-Ping Yan, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 97 days.

(21) Appl. No.: 13/762,388

(22) Filed: Feb. 8, 2013

(65) Prior Publication Data

US 2014/0002090 A1     Jan. 2, 2014

(30) Foreign Application Priority Data

Jul. 2, 2012   (TW) .............................. 101123728 A

(51) Int. Cl.
*G01R 31/44*        (2006.01)
*G09G 3/00*        (2006.01)

(52) U.S. Cl.
CPC ................ *G01R 31/44* (2013.01); *G09G 3/006* (2013.01)

(58) Field of Classification Search
CPC .............. G02F 1/13458; G02F 1/1362; G02F 2001/136254; G02F 1/1345; G02F 1/136286; G02F 1/1309; G02F 1/133351; G02F 2001/136263; G02F 1/1303; G02F 1/1343; G09G 3/006; G09G 3/3648; G09G 3/3611; G09G 2300/0426; G09G 2300/0408; G09G 3/2092; G01R 31/44; H01L 27/12

USPC ........... 324/760.01, 770, 414, 760.02, 750.3, 324/555; 349/54, 138, 139, 143, 149, 192; 345/87, 92, 173, 174, 622, 904
See application file for complete search history.

(56) References Cited

U.S. PATENT DOCUMENTS

| | | | |
|---|---|---|---|
| 5,530,568 A | 6/1996 | Yamamoto et al. | |
| 5,949,502 A * | 9/1999 | Matsunaga et al. | 349/40 |
| 7,133,039 B2 | 11/2006 | Moon et al. | |
| 7,580,107 B2 | 8/2009 | Moon | |
| 7,724,019 B2 | 5/2010 | Chang et al. | |
| 7,733,312 B2 | 6/2010 | Moon et al. | |
| 7,777,854 B2 | 8/2010 | Moon | |
| 2004/0119925 A1* | 6/2004 | Moon | 349/139 |
| 2005/0078057 A1* | 4/2005 | Chang et al. | 345/55 |
| 2006/0103410 A1* | 5/2006 | Jeon | 324/770 |
| 2009/0219457 A1* | 9/2009 | Seo et al. | 349/55 |
| 2010/0109993 A1 | 5/2010 | Chang | |
| 2010/0144229 A1* | 6/2010 | Lee | 445/3 |
| 2012/0262184 A1* | 10/2012 | Shen | 324/537 |

* cited by examiner

*Primary Examiner* — Arleen M Vazquez
*Assistant Examiner* — Lee Rodak
(74) *Attorney, Agent, or Firm* — Jianq Chyun IP Office

(57) ABSTRACT

A test structure of a display panel is provided. The display panel has a display region, a non-display region, and a buffer display region between the display region and non-display region. The test structure is within the buffer display region and includes a substrate, at least one signal line on the substrate, an insulation layer covering the signal line, a planar layer on the insulation layer, and an electrode layer on the planar layer. The planar layer has at least one opening exposing a portion of the insulation layer. The electrode layer has a display electrode portion on the planar layer, at least one test electrode portion connecting the insulation layer via the opening of the planar layer, and a ring-like opening that surrounds the test electrode portion and exposes a portion of the planar layer. The display electrode portion surrounds the ring-like opening and connects the test electrode portion.

13 Claims, 4 Drawing Sheets

TEST STRUCTURE OF DISPLAY PANEL AND TESTING METHOD THEREOF AND TEST STRUCTURE OF TESTED DISPLAY PANEL

CROSS-REFERENCE TO RELATED APPLICATION

This application claims the priority benefit of Taiwan application serial no. 101123728, filed on Jul. 2, 2012. The entirety of the above-mentioned patent application is hereby incorporated by reference herein and made a part of this specification.

BACKGROUND OF THE INVENTION

1. Field of Invention

The invention is directed to a test structure and a testing method thereof. More particularly, the invention is directed to a test structure of a display panel, a testing method of a test structure of a display panel, and a test structure of a tested display panel.

2. Background of the Invention

Generally, in a process of manufacturing a display panel, a signal line on a substrate is often required to undergo electrical inspection, so as to determine whether the signal line is functioned well. According to the inspection method, a specific signal is input to the to-be-tested signal line, and an output signal is received from an end of the signal line; thereby, whether the electrical properties of the signal line are favorable may be determined.

At present, to measure the signal output from the end of the signal line, a probe is employed to directly contact the end of the signal line, so as to receive the output signal. To enable the probe to contact the end of the signal line, it is often required to destructively cleave and pierce the substrate above the end of the signal line, so as to expose the end of the signal line. Thereby, the inspection procedure becomes more complicated, and significant time is required to be spent on the inspection. Moreover, it is difficult to accurately and successfully cleave and pierce the substrate. In addition, due to the conventional requirement for destructively cleaving and piercing the substrate above the end of the signal line, the location where the inspection is performed with use of the probe is often in a non-display region of the display panel, so as not to hinder the consistent display of the entire frame.

SUMMARY OF THE INVENTION

The invention is directed to a test structure of a display panel and a testing method thereof. Here, the test structure is located in a buffer display region of the display panel, and a signal output from a signal line may be measured without cleaving and piercing a substrate. Besides, the display panel may have favorable imaging quality.

The invention is further directed to a test structure of a tested display panel, and the test structure is formed by performing said testing method.

In an embodiment of the invention, a test structure of a display panel is provided. The display panel has a display region, a non-display region, and a buffer display region that is located between the display region and the non-display region. The test structure is located within the buffer display region of the display panel. Here, the test structure includes a substrate, at least one signal line, an insulation layer, a planar layer, and an electrode layer. The signal line is disposed on the substrate. The insulation layer covers the signal line. The planar layer is disposed on the insulation layer and has at least one opening that exposes a portion of the insulation layer. The electrode layer is disposed on the planar layer and has a display electrode portion, at least one test electrode portion, and a ring-like opening. The ring-like opening surrounds the test electrode portion and exposes a portion of the planar layer. The test electrode portion is connected to the insulation layer via the opening of the planar layer. The display electrode portion is located on the planar layer, surrounds the ring-like opening, and is connected to the test electrode portion.

According to an embodiment of the invention, the display panel includes an electrophoretic display panel.

According to an embodiment of the invention, the ring-like opening has a first end and a second end opposite to each other, and a gap is between the first end and the second end. The display electrode portion extends into the gap and is electrically connected to the test electrode portion.

According to an embodiment of the invention, a region where the display electrode portion and the test electrode portion are connected has an orthogonal projection on the substrate, and the orthogonal projection of the region is not overlapped with an orthogonal projection of the signal line on the substrate.

In an embodiment of the invention, a testing method of a test structure of a display panel is provided. The testing method includes following steps. A display panel is provided. The display panel has a display region, a non-display region, a buffer display region located between the display region and the non-display region, and at least one test structure located in the buffer display region. Here, the test structure includes a substrate, at least one signal line, an insulation layer, a planar layer, and an electrode layer. The signal line is disposed on the substrate. The insulation layer covers the signal line. The planar layer is disposed on the insulation layer and has at least one opening that exposes a portion of the insulation layer. The electrode layer is disposed on the planar layer and has a display electrode portion, at least one test electrode portion, and a ring-like opening. The ring-like opening surrounds the test electrode portion and exposes a portion of the planar layer. The test electrode portion is connected to the insulation layer via the opening of the planar layer. The display electrode portion is located on the planar layer, surrounds the ring-like opening, and is connected to the test electrode portion. A cutting process is performed on a region where the display electrode portion and the test electrode portion are connected, such that the ring-like opening is transformed into a ring-shaped port. The display electrode portion and the test electrode portion are apart from each other by the ring-shaped port, and are electrically insulated from each other. A fusing process is performed on the test electrode portion that is electrically insulated from the display electrode portion, such that the test electrode portion is electrically connected to the signal line. A test signal is input to the signal line, and an output signal is measured from the test electrode portion that is electrically connected to the signal line.

According to an embodiment of the invention, the cutting process includes a laser cutting process.

According to an embodiment of the invention, the fusing process includes a laser fusing process.

According to an embodiment of the invention, the display panel includes an electrophoretic display panel.

According to an embodiment of the invention, a region where the display electrode portion and the test electrode portion are connected has an orthogonal projection on the substrate, and the orthogonal projection of the region is not overlapped with an orthogonal projection of the signal line on the substrate.

According to an embodiment of the invention, a test structure of a tested display panel is provided. The display panel has a display region, a non-display region, and a buffer display region that is located between the display region and the non-display region. The test structure is located within the buffer display region of the display panel. Here, the test structure includes a substrate, at least one signal line, an insulation layer, a planar layer, and an electrode layer. The signal line is disposed on the substrate. The insulation layer covers the signal line. The planar layer is disposed on the insulation layer and has at least one opening that exposes a portion of the insulation layer. The electrode layer is disposed on the planar layer and has a display electrode portion, at least one test electrode portion, a ring-shaped port, and a conductive channel. The ring-shaped port surrounds the test electrode portion and exposes a portion of the planar layer. The test electrode portion is connected to the insulation layer via the opening of the planar layer. The conductive channel extends from the test electrode portion to the signal line. The test electrode portion is electrically connected to the signal line through the conductive channel. The display electrode portion is located on the planar layer and surrounds the ring-shaped port. Besides, the display electrode portion is electrically insulated from the test electrode portion.

According to an embodiment of the invention, the display panel includes an electrophoretic display panel.

In view of the above, the test structure of the display panel described herein is equipped with the electrode layer that has the ring-like opening. Therefore, before the electrical inspection is conducted, the display electrode portion and the test electrode portion of the electrode layer are structurally and electrically connected to each other and may perform the display function; during the electrical inspection, a cutting process may be carried out to transform the ring-like opening into a ring-shaped port, such that the display electrode portion and the test electrode portion are electrically insulated from each other. Moreover, a fusing process may be performed to electrically connect the test electrode portion to the signal line, and thereby the electric signal of the signal line may be measured from the test electrode portion. Compared to the conventional test structure located in the non-display region of the display panel, the test structure described in an embodiment of the invention is located in a buffer display region rather than in the non-display region. Besides, according to an embodiment of the invention, the output signal of the signal line may be measured in no need of cleaving or piercing the substrate, and the overall imaging quality of the display panel may still remain satisfactory.

Several exemplary embodiments accompanied with figures are described in detail below to further explain the invention.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EXEMPLARY EMBODIMENTS

Figure 1A:
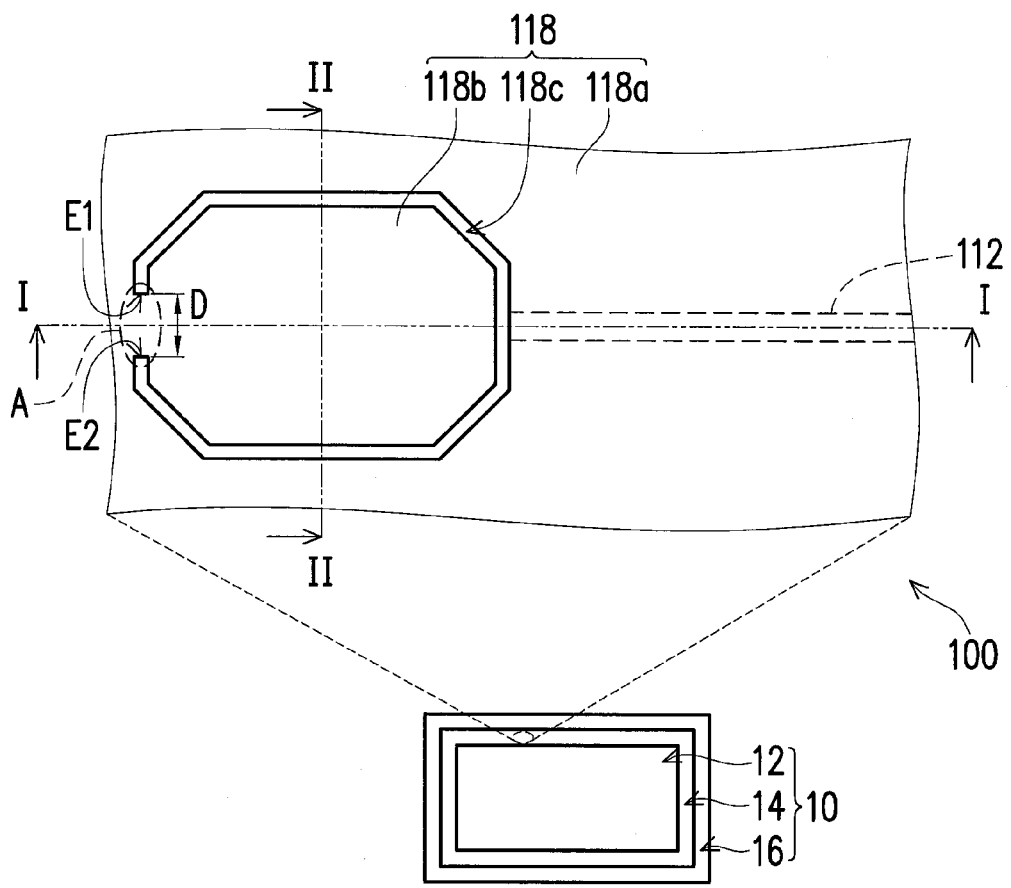
FIG. 1A is a schematic top view illustrating a test structure of a display panel according to an embodiment of the invention.
Figure 1B:
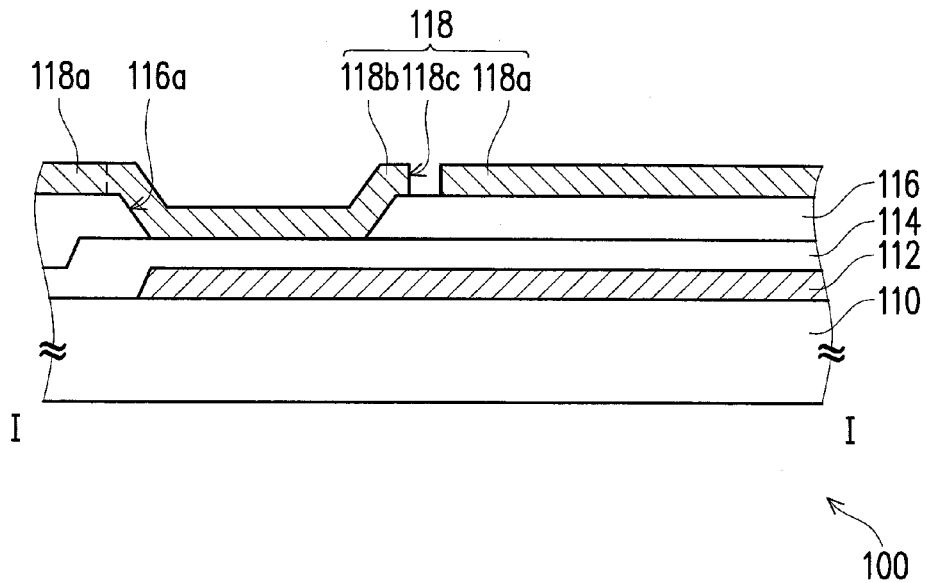
FIG. 1B is a schematic cross-sectional view taken along a line I-I in FIG. 1A.
Figure 1C:
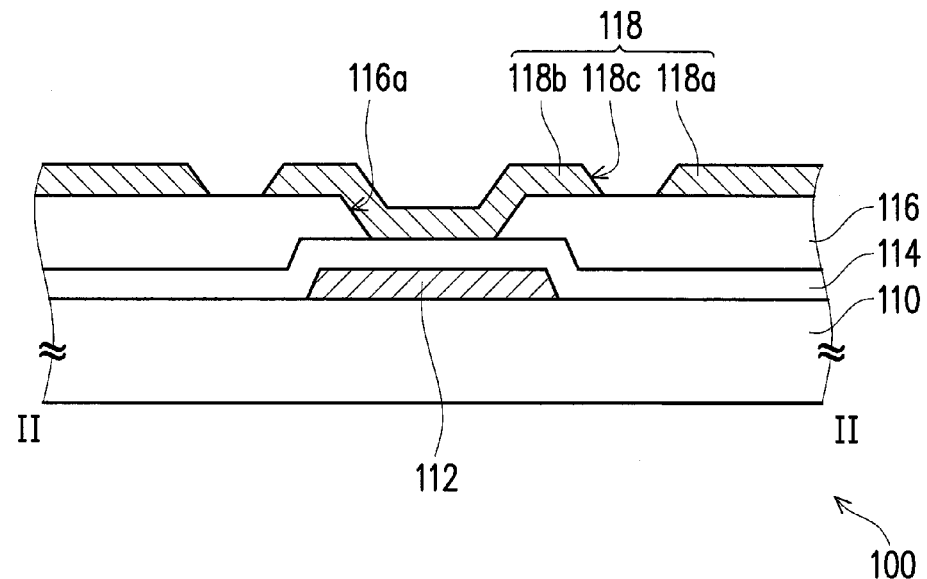
FIG. 1C is a schematic cross-sectional view taken along a line II-II in FIG. 1A.

FIG. 1A is a schematic top view illustrating a test structure of a display panel according to an embodiment of the invention. FIG. 1B is a schematic cross-sectional view taken along a line I-I in FIG. 1A. FIG. 1C is a schematic cross-sectional view taken along a line II-II in FIG. 1A. With reference to FIG. 1A, FIG. 1B, and FIG. 1C, in the present embodiment, the display panel 10 has a display region 12, a non-display region 16, and a buffer display region 14 that is located between the display region 12 and the non-display region 16. A test structure 100 of the display panel 10 is located within the buffer display region 14 of the display panel 10. Here, the display panel 10 is an electrophoretic display panel, for instance.

Specifically, the test structure 100 includes a substrate 110, at least one signal line 112, an insulation layer 114, a planar layer 116, and an electrode layer 118. The signal line 112 is disposed on the substrate 110. The insulation layer 114 covers the signal line 112. The planar layer 116 is disposed on the insulation layer 114 and has at least one opening 116a that exposes a portion of the insulation layer 114. The electrode layer 118 is disposed on the planar layer 116 and has a display electrode portion 118a, at least one test electrode portion 118b, and a ring-like opening 118c. Particularly, the ring-like opening 118c surrounds the test electrode portion 118b and exposes a portion of the planar layer 116. The test electrode portion 118b is structurally connected to the insulation layer 114 via the opening 116a of the planar layer 116. The display electrode portion 118a is located on the planar layer 116, surrounds the ring-like opening 118c, and is structurally and electrically connected to the test electrode portion 118b.

To be more specific, according to the present embodiment, the ring-like opening 118c of the electrode layer 118 has a first end E1 and a second end E2 opposite to each other, and a gap D is between the first end E1 and the second end E2. The display electrode portion 118a of the electrode layer 118 extends into the gap D and is structurally and electrically connected to the test electrode portion 118b. In addition, a region A where the display electrode portion 118a and the test electrode portion 118b are connected has an orthogonal projection on the substrate 110, and the orthogonal projection of the region A is not overlapped with an orthogonal projection of the signal line 112 on the substrate 110.

The display electrode portion 118a and the test electrode portion 118b described in the present embodiment belong to the same film layer, i.e., the electrode layer 118, and the electrode layer 118 is located within the buffer display region 14 of the display panel 10. Therefore, prior to the electrical inspection, the display electrode portion 118a and the test electrode portion 118b both have the same display function. Conventionally, the location where the inspection is performed with use of the probe is in the non-display region of the display panel, and the conventional test structure located in the non-display region does not achieve the display function. By contrast, the display panel 10 described in the present embodiment has a larger visible area.

Figure 2A:
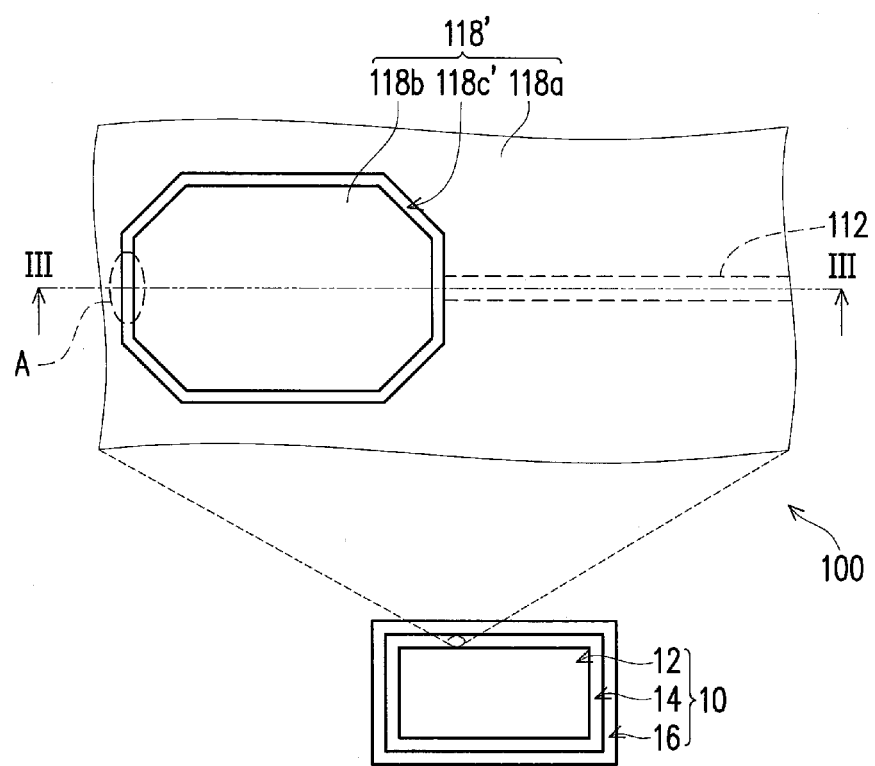
FIG. 2A is a schematic top view illustrating a test structure of a tested display panel according to an embodiment of the invention.
Figure 2B:
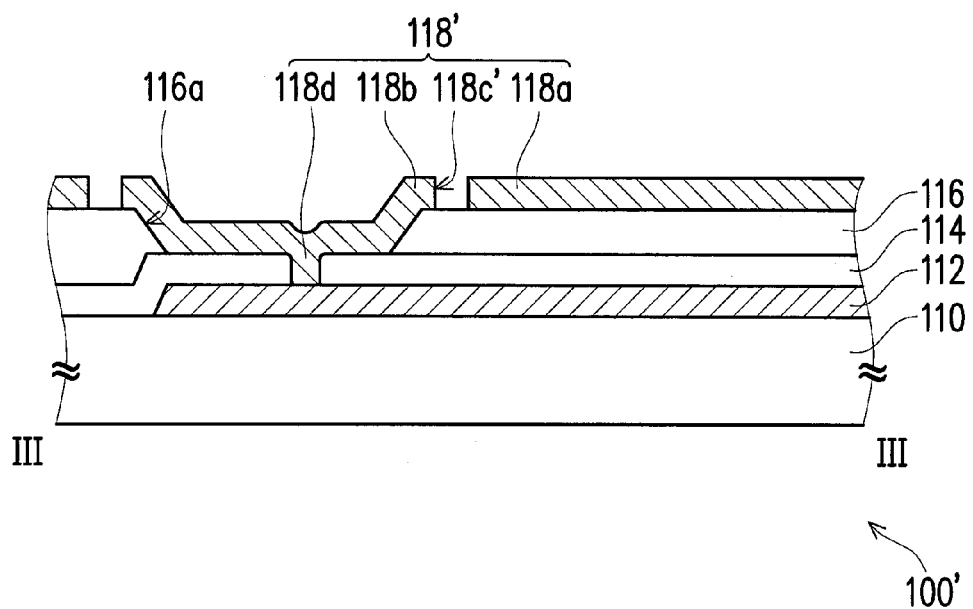
FIG. 2B is a schematic cross-sectional view taken along a line in FIG. 2A.

A testing method of the test structure of the display panel and a test structure of a tested display panel are elaborated hereinafter with reference to FIG. 1A to FIG. 1C and FIG. 2A to FIG. 2B. FIG. 2A is a schematic top view illustrating a test structure of a tested display panel according to an embodiment of the invention. FIG. 2B is a schematic cross-sectional view taken along a line in FIG. 2A. Note that the same reference numbers representing the same or similar components described in the previous embodiment are applied in the following embodiments, and repetitive explanation in the previous embodiment and in the following embodiment is omitted. For a detailed description of this section, reference can be found in the previous embodiment of the invention, and therefore no further description is provided herein.

As shown in FIG. 1A, FIG. 1B, and FIG. 1C, according to the testing method described in the present embodiment, a display panel 10 is provided at first. The display panel 10 has a display region 12, a non-display region 16, a buffer display region 14 located between the display region 12 and the non-display region 16, and at least one test structure 100 located in the buffer display region 14. Here, the display panel 10 is an electrophoretic display panel, for instance. The test structure 100 includes a substrate 110, at least one signal line 112, an insulation layer 114, a planar layer 116, and an electrode layer 118. The signal line 112 is disposed on the substrate 110. The insulation layer 114 covers the signal line 112. The planar layer 116 is disposed on the insulation layer 114 and has at least one opening 116a that exposes a portion of the insulation layer 114. The electrode layer 118 is disposed on the planar layer 116 and has a display electrode portion 118a, at least one test electrode portion 118b, and a ring-like opening 118c. Particularly, the ring-like opening 118c surrounds the test electrode portion 118b and exposes a portion of the planar layer 116. The test electrode portion 118b is structurally connected to the insulation layer 114 via the opening 116a of the planar layer 116. The display electrode portion 118a is located on the planar layer 116, surrounds the ring-like opening 118c, and is structurally and electrically connected to the test electrode portion 118b. Here, a region A where the display electrode portion 118a and the test electrode portion 118b are connected has an orthogonal projection on the substrate 110, and the orthogonal projection of the region A is not overlapped with an orthogonal projection of the signal line 112 on the substrate 110.

With reference to FIG. 2A and FIG. 2B, a cutting process is performed on the region A where the display electrode portion 118a and the test electrode portion 118b are connected, such that the ring-like opening 118c is transformed into a ring-shaped port 118c'. The display electrode portion 118a and the test electrode portion 118b are apart from each other by the ring-shaped port 118c', and are electrically insulated from each other. Here, the cutting process is a laser cutting process, for instance.

As shown in FIG. 2A and FIG. 2B, a fusing process is performed on the test electrode portion 118b that is electrically insulated from the display electrode portion 118a, such that the test electrode portion 118b is electrically connected to the signal line 112. Here, the fusing process is a laser fusing process, for instance. A test signal is input to the signal line 112, and an output signal is measured from the test electrode portion 118b that is electrically connected to the signal line 112. Thereby, the electric signal of the signal line 112 may be obtained, and the electrical inspection may be completed.

The test structure 100 of the display panel 10 described herein is equipped with the electrode layer 118 that has the ring-like opening 118c. Therefore, during the electrical inspection, the cutting process may be carried out to transform the ring-like opening 118c into the ring-shaped port 118c', such that the display electrode portion 118a and the test electrode portion 118b are electrically insulated from each other. Moreover, the fusing process may be performed to electrically connect the test electrode portion 118b to the signal line 112, and thereby the electric signal of the signal line 112 may be measured from the test electrode portion 118b. Compared to the conventional testing method, the testing method of the test structure 100 of the display panel 10 described in the present embodiment does not require the step of cleaving or piercing the substrate 110, and the output signal of the signal line 112 may still be measured. Further, the overall imaging quality of the display panel 110 may still remain satisfactory. Hence, the testing method of the of the test structure 100 of the display panel 10 described in the present embodiment is rather simple and may effectively reduce the inspection time.

Structurally speaking, as shown in FIG. 2A and FIG. 2B, a test structure 100' of the tested display panel 10 is located within the buffer display region 14 of the display panel 10. The test structure 100' includes a substrate 110, a signal line 112, an insulation layer 114, a planar layer 116, and an electrode layer 118'. The signal line 112 is disposed on the substrate 110. The insulation layer 114 covers the signal line 112. The planar layer 116 is disposed on the insulation layer 114 and has an opening 116a that exposes a portion of the insulation layer 114. The electrode layer 118' is disposed on the planar layer 116 and has a display electrode portion 118a, a test electrode portion 118b, a ring-shaped port 118c', and a conductive channel 118d. The ring-shaped port 118c' surrounds the test electrode portion 118b and exposes a portion of the planar layer 116. The test electrode portion 118b is connected to the insulation layer 114 via the opening 116a of the planar layer 116. The conductive channel 118d extends from the test electrode portion 118b to the signal line 112. The test electrode portion 118b is electrically connected to the signal line 112 through the conductive channel 118d. The display electrode portion 118a is located on the planar layer 116, surrounds the ring-shaped port 118c', and is electrically insulated from the test electrode portion 118b.

To sum up, the test structure of the display panel described herein is equipped with the electrode layer that has the ring-like opening. Therefore, before the electrical inspection is conducted, the display electrode portion and the test electrode portion of the electrode layer are structurally and electrically connected to each other and may perform the display function; during the electrical inspection, a cutting process may be carried out to transform the ring-like opening into a ring-shaped port, such that the display electrode portion and the test electrode portion are electrically insulated from each other. Moreover, a fusing process may be performed to electrically connect the test electrode portion to the signal line, and thereby the electric signal of the signal line may be measured from the test electrode portion. Compared to the conventional test structure located in the non-display region of the display panel, the test structure described in an embodiment of the invention is located in a buffer display region rather than in the non-display region. Besides, according to an embodiment of the invention, the output signal of the signal line may be measured in no need of cleaving or piercing the substrate, and the overall imaging quality of the display panel may still remain satisfactory.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A test structure of a display panel, the display panel having a display region, a non-display region, and a buffer display region located between the display region and the non-display region, the test structure being located within the buffer display region of the display panel and comprising:
   a substrate;
   at least one signal line disposed on the substrate;
   an insulation layer covering the at least one signal line;
   a planar layer disposed on the insulation layer, the planar layer having at least one opening exposing a portion of the insulation layer; and
   an electrode layer disposed on the planar layer, the electrode layer having a ring-like opening, wherein the ring-like opening is a continuous ring structure and has a first end and a second end at the same plane and opposite to each other, a gap is between the first end and the second end, and the ring-like opening divided the electrode layer into a display electrode and at least one test electrode portion, the ring-like opening surrounds the at least one test electrode portion and exposes a portion of the planar layer, the at least one test electrode portion is connected to the insulation layer via the at least one opening of the planar layer, and the display electrode portion is located on the planar layer, surrounds the ring-like opening and extends into the gap, and is electrically connected to the at least one test electrode portion.

2. The test structure of the display panel as recited in claim 1, wherein the display panel comprises an electrophoretic display panel.

3. The test structure of the display panel as recited in claim 1, wherein a region where the display electrode portion and the at least one test electrode portion are connected has an orthogonal projection on the substrate, and the orthogonal projection of the region is not overlapped with an orthogonal projection of the at least one signal line on the substrate.

4. A test structure of a display panel, the display panel having a display region, a non-display region, and a buffer display region located between the display region and the non-display region, the test structure being located within the buffer display region of the display panel and comprising:
   a substrate;
   at least one signal line disposed on the substrate;
   an insulation layer covering the at least one signal line;
   a planar layer disposed on the insulation layer, the planar layer having at least one opening exposing a portion of the insulation layer; and
   an electrode layer disposed on the planar layer, the electrode layer having a display electrode portion, at least one test electrode portion, and a continuous demarcation opening, wherein the continuous demarcation opening is located between the display electrode portion and the at least one test electrode portion to define at least a portion of an edge of the at least one test electrode portion and exposes a portion of the planar layer, the at least one test electrode portion is disposed in contact with the insulation layer in the at least one opening of the planar layer, and the display electrode portion surrounds the at least one test electrode portion.

5. The test structure of the display panel as recited in claim 4, wherein the display panel comprises an electrophoretic display panel.

6. The test structure of the display panel as recited in claim 4, wherein the continuous demarcation opening is a ring-like opening having a first end and a second end opposite to each other, a gap is between the first end and the second end, and the display electrode portion extends into the gap and is electrically connected to the at least one test electrode portion.

7. The test structure of the display panel as recited in claim 4, wherein the electrode layer further has a connecting portion connecting the at least one test electrode portion and the display electrode portion, the connecting portion has an orthogonal projection on the substrate, and the orthogonal projection of the connecting portion is not overlapped with an orthogonal projection of the at least one signal line on the substrate.

8. The test structure of the display panel as recited in claim 4, wherein the continuous demarcation opening is a ring-shaped port to define the whole edge of the at least one test electrode portion, the electrode layer further have a conductive channel, the at least one test electrode portion is electrically connected to the at least one signal line through the conductive channel, and the display electrode portion is located on the planar layer, surrounds the ring-shaped port, and is electrically insulated from the at least one test electrode portion.

9. A testing method of a test structure of a display panel, the testing method comprising:
   providing a display panel, the display panel having a display region, a non-display region, a buffer display region between the display region and the non-display region, and at least one test structure located within the buffer display region, the at least one test structure comprising:
      a substrate;
      at least one signal line disposed on the substrate;
      an insulation layer covering the at least one signal line;
      a planar layer disposed on the insulation layer, the planar layer having at least one opening exposing a portion of the insulation layer; and
      an electrode layer disposed on the planar layer, the electrode layer having a ring-like opening, wherein the ring-like opening is a continuous ring structure and has a first end and a second end at the same plane and opposite to each other, a gap is between the first end and the second end, and the ring-like opening divided the electrode layer into a display electrode and at least one test electrode portion, the ring-like opening surrounds the at least one test electrode portion and exposes a portion of the planar layer, the at least one test electrode portion is connected to the insulation layer via the at least one opening of the planar layer, and the display electrode portion is located on the planar layer, surrounds the ring-like opening and extends into the gap, and is electrically connected to the at least one test electrode portion;
   performing a cutting process on a region where the display electrode portion and the at least one test electrode portion are connected, such that the ring-like opening is transformed into a ring-shaped port, wherein the display electrode portion and the at least one test electrode portion are apart from each other by the ring-shaped port, and are electrically insulated from each other;
   performing a fusing process on the at least one test electrode portion electrically insulated from the display electrode portion, such that the at least one test electrode portion is electrically connected to the at least one signal line; and
   inputting a test signal to the at least one signal line and measuring an output signal from the at least one test electrode portion electrically connected to the at least one signal line.

10. The testing method of the test structure of the display panel as recited in claim 9, wherein the cutting process comprises a laser cutting process.

11. The testing method of the test structure of the display panel as recited in claim 9, wherein the fusing process comprises a laser fusing process.

12. The testing method of the test structure of the display panel as recited in claim 9, wherein the display panel comprises an electrophoretic display panel.

13. The testing method of the test structure of the display panel as recited in claim 9, wherein a region where the display electrode portion and the at least one test electrode portion are connected has an orthogonal projection on the substrate, and the orthogonal projection of the region is not overlapped with an orthogonal projection of the at least one signal line on the substrate.

\* \* \* \* \*